United States Patent
Canclini et al.

(10) Patent No.: US 11,843,381 B2
(45) Date of Patent: Dec. 12, 2023

(54) RING-OSCILLATOR CONTROL CIRCUIT AND METHOD THEREOF

(71) Applicant: EM Microelectronic-Marin SA, Marin (CH)

(72) Inventors: Athos Canclini, Neuchâtel (CH); Mario Dellea, La Chaux-de-Fonds (CH); Can Baltaci, Lausanne (CH); Clement Cheung, Neuchâtel (CH)

(73) Assignee: EM Microelectronic-Marin SA, Marin (CH)

(*) Notice: Subject to any disclaimer, the term of this patent is extended or adjusted under 35 U.S.C. 154(b) by 0 days.

(21) Appl. No.: 18/085,862

(22) Filed: Dec. 21, 2022

(65) Prior Publication Data
US 2023/0208405 A1 Jun. 29, 2023

(30) Foreign Application Priority Data
Dec. 29, 2021 (EP) .................................... 21218214

(51) Int. Cl.
  *H03K 3/03* (2006.01)
  *H03K 17/687* (2006.01)
  *H03K 3/013* (2006.01)
  *H03K 3/011* (2006.01)

(52) U.S. Cl.
  CPC .......... *H03K 3/0315* (2013.01); *H03K 3/011* (2013.01); *H03K 3/013* (2013.01); *H03K 17/6874* (2013.01)

(58) Field of Classification Search
  CPC .. H03K 17/6874; H03K 3/0315; H03K 3/011; H03K 3/013; G05F 3/262
  USPC .................................................... 331/183, 57
  See application file for complete search history.

(56) References Cited

U.S. PATENT DOCUMENTS

| 10,819,317 B1* | 10/2020 | Lahiri .................. H03K 3/0315 |
| 2011/0316639 A1* | 12/2011 | Fischette ................ H03L 7/093 331/183 |
| 2021/0091784 A1* | 3/2021 | Tseng ...................... H03L 7/099 |

FOREIGN PATENT DOCUMENTS

| CN | 102332910 A | 1/2012 |
| CN | 106209025 A | 12/2016 |
| CN | 107241083 B | 8/2020 |

OTHER PUBLICATIONS

The Extended European Search Report of No. 21218214.1 dated Jun. 30, 2022.

* cited by examiner

*Primary Examiner* — Arnold M Kinkead
(74) *Attorney, Agent, or Firm* — Sughrue Mion, PLLC

(57) ABSTRACT

According to an aspect of the disclosure a ring-oscillator control circuit includes a voltage reference, a ring oscillator, a power supply and a supply controller. The supply controller may be configured to select the power supply among an energy storage and an energy source such as to supply the ring oscillator in function of the voltage reference.

11 Claims, 1 Drawing Sheet

RING-OSCILLATOR CONTROL CIRCUIT AND METHOD THEREOF

CROSS REFERENCE TO RELATED APPLICATIONS

This application is claiming priority based on European Patent Application No. 21218214.1 filed on Dec. 29, 2021.

TECHNICAL FIELD

The present invention relates to ring-oscillator, in particular ring oscillator control circuit.

STATE OF THE ART

Ring oscillators are commonly used in many systems because of their wide tuning range, compact layout, and ability to generate multiple phases. The concept of an oscillator consisting of gain stages in a ring can be traced to the vacuum-tube era.

Although a ring oscillator is generally simple to implement, it is generally little used for generating a clock signal. In fact, it is relatively unstable, for example in response to variations due to manufacturing methods. Moreover, ring oscillators generally require a stabilization time before supplying a stable oscillating signal, thereby delaying the start, the restart or a synchronization of the oscillating signal.

SUMMARY OF THE INVENTION

The present invention aims to overcome these drawbacks, and therefore has for its object to provides a ring-oscillator Control circuit comprising at least one:
Voltage reference: said at least one voltage reference being configured to hold a voltage reference value;
Ring oscillator: said at least one ring oscillator being configured to oscillate;
Power supply: said at least one power supply comprising at least one energy storage configured to supply said at least one ring oscillator, and at least one energy source configured to supply said at least one voltage reference and said at least one ring oscillator; and,
Supply controller: said at least one supply controller being configured to select said at least one power supply among said at least one energy storage and said at least one energy source such as to supply said at least one ring oscillator in function of said at least one voltage reference.

According to an embodiment, said at least one energy source comprises at least one current mirror configured to be connected to said at least one supply controller; said at least one current mirror comprises an input diode connected PMOS transistor and a second PMOS transistor.

According to an embodiment, said input diode connected PMOS transistor comprises a first PMOS source connected to a first power terminal, a first PMOS drain connected to a first PMOS gate, and to a first input controller terminal of said at least one supply controller.

According to an embodiment, said second PMOS transistor comprises a second PMOS source connected to a first power terminal, said second PMOS gate connected to said first PMOS gate, and a second PMOS drain connected to a second controller terminal of said at least one supply controller.

According to an embodiment, said at least one supply controller comprises at least one main switch configured to be connected to said second controller terminal, to said at least one energy storage and to said at least one ring oscillator, and comprises at least one reference switch configured to be connected to said at least one voltage reference and to said first input controller terminal.

According to an embodiment, said at least one supply controller comprises at least one comparator having said first input controller terminal, said second controller terminal and a output controller terminal; said output controller terminal is configured to control said at least one main switch and said at least one reference switch such as to select said at least one power supply of said at least one ring oscillator in function of said at least one voltage reference.

The present invention aims to overcome these drawbacks, and therefore has for its object to provides a Ring-oscillator Control method for a ring-oscillator Control circuit; said ring-oscillator Control circuit comprising at least one energy storage, at least one ring oscillator, at least one voltage reference, and at least one supply controller; said ring-oscillator control method comprising at least one:
Comparison: said at least one comparison compares the supply voltage value of said at least one ring oscillator with the reference voltage value of said at least one voltage reference;
Selection: said at least one selection supplies said at least one ring oscillator by selecting said at least one energy storage as power supply when said supply voltage value is different from said reference voltage value.

According to an embodiment said at least one selection occurs when said supply voltage value is greater than said reference voltage value.

BRIEF DESCRIPTION OF THE DRAWINGS

The foregoing and other purposes, features, aspects and advantages of the invention will become apparent from the following detailed description of the embodiments, given by way of illustration and not limitation with reference to the accompanying drawings, in which.

DESCRIPTION OF THE INVENTION

Figure 1:
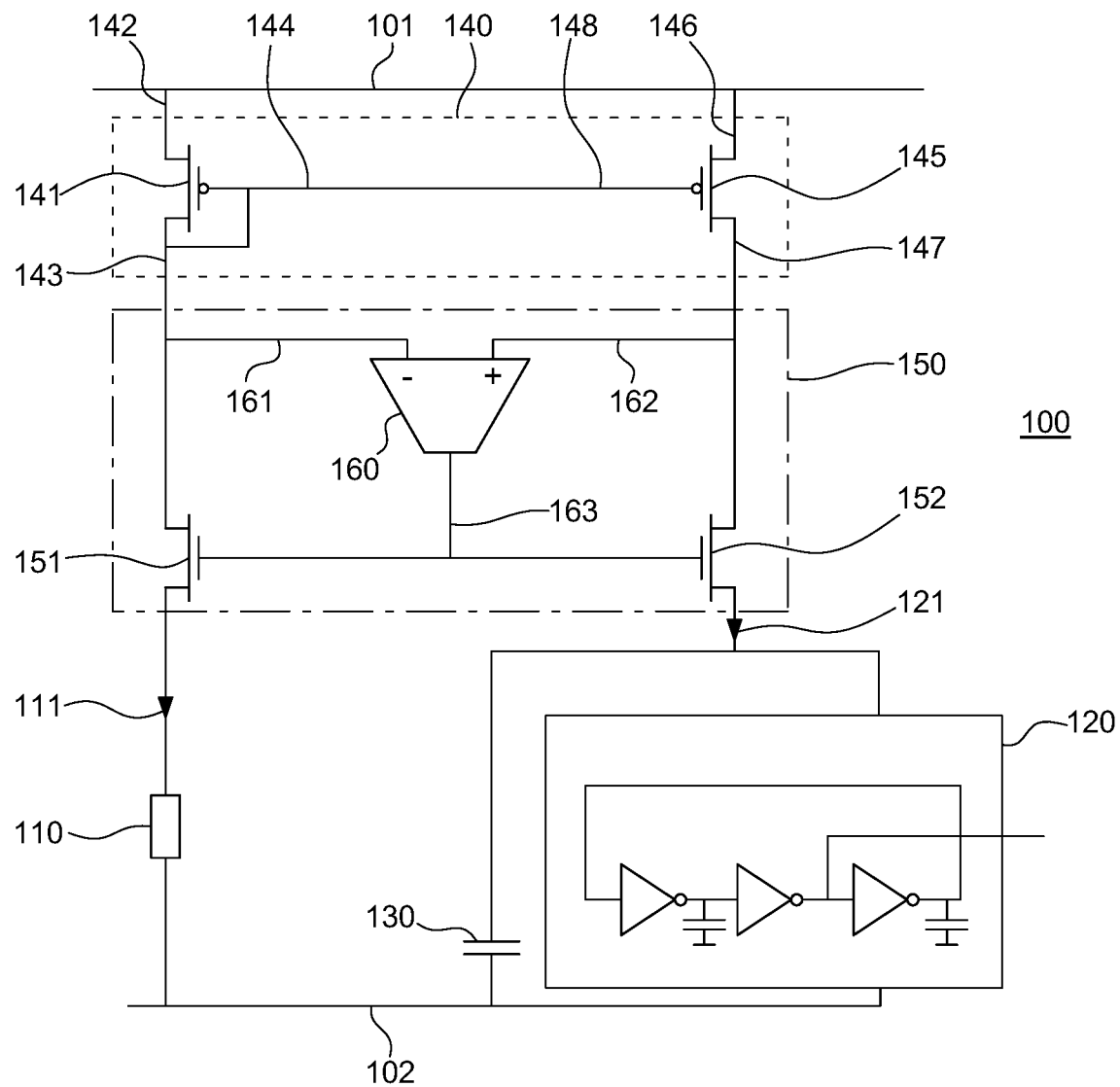
FIG. 1 represents a ring-oscillator Control circuit (100) according to an embodiment.
Figure 2:
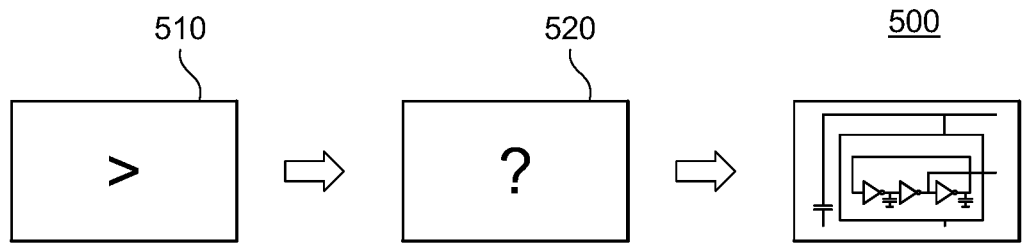
FIG. 2 illustrates a ring-oscillator Control method (500).

The present invention relates to a ring-oscillator Control circuit 100 disposed between a first power terminal 101 and a second power terminal 102, and comprising at least one voltage reference 110, at least one ring oscillator 120, at least one power supply 130, 140 and at least one supply controller 150.

As depicted in FIG. 1, said at least one supply controller 150 may comprise a first input controller terminal 161, a second input controller terminal 162, at least one main switch 152 and at least one reference switch 151. Said at least one main switch 152 may be connected to said second controller terminal 162, and to said at least one ring oscillator 120, while said at least one reference switch 151 may be connected to said at least one voltage reference 110 and to said first input controller terminal 161.

Always in FIG. 1, said at least one power supply 130, 140 may be connected to said first power terminal 101 and may comprise at least one energy storage 130 configured to supply said at least one ring oscillator 120 and at least one energy source 140. The first, i.e. said at least one energy storage 130 may comprise at least one capacitor 130, and the second i.e. said at least one energy source 140 may comprise at least one current mirror 140. Said at least one current mirror 140 may be connected to said at least one supply controller 150, and said at least one current mirror 140 may comprise an input diode connected PMOS transistor 141 and a second PMOS transistor 145, as illustrated in FIG. 1.

Said input diode connected PMOS transistor 141 may comprise a first PMOS source 142 connected to said first power terminal 101, a first PMOS gate 144, a first PMOS drain 143 connected to a first PMOS gate 144 in a diode mode and to said first input controller terminal 161. On other side, said second PMOS transistor 145 may comprise a second PMOS source 146 connected to said first power terminal 101 as well, said second PMOS gate 148 connected to said first PMOS gate 144, and a second PMOS drain 147 connected to a second controller terminal 162 of said at least one supply controller 150.

The latter, i.e. said at least one supply controller 150 may comprise at least one comparator 160 having said first input controller terminal 161, said second controller terminal 162 and a output controller terminal 163. Said output controller terminal 163 may control said at least one main switch 152 and said at least one reference switch 151 such as to select said at least one power supply 130, 140 of said at least one ring oscillator 120 in function of said at least one voltage reference 110.

Said at least one ring oscillator 120 may comprise a plurality of gain stages in a loop, with negative feedback at low frequencies to avoid latch-up. A rising edge at a node within the loop travels the plurality of inverters and returns as a falling edge, forming one half of the oscillation for example. Since the delay of an inverter falls as the supply voltage may increases, the oscillation frequency is inversely proportional to the supply voltage. This supply sensitivity may prove serious as noise on VDD directly modulates the output frequency.

Further, an N-stage ring provides N output phases with a minimum separation of seconds, but, due to the inversion in each stage, the actual phase difference is inversely proportional to the number of stage. However, a ring may comprise only three stages that does not provide complete switching because the delay through the loop is too short.

Further, since said at least one ring oscillator 120 may oscillate, the oscillation of said at least one ring oscillator 120 may need more or less energy and may drain more or less energy, which may lead to some variation of the oscillation.

In case said at least one ring oscillator 120 may drain more energy, said at least one supply controller 150 may sense the supply voltage value 121 of said at least one ring oscillator 120 decreasing. Said at least one supply controller 150 may compare 510 the reference voltage value 111 of said at least one voltage reference 110 and said supply voltage value 121, and said at least one supply controller 150 may realize that said reference voltage value 111 may be superior than said supply voltage value 121. Since, said output controller terminal 163 may control said at least one main switch 152 and said at least one reference switch 151, said at least one supply controller 150 may select 520 said at least one power supply 130, 140 of said at least one ring oscillator 120 by switching off said at least one main switch 152 and/or said at least one reference switch 151, typically both may be a PMOS Transistor.

Consequently, no current may flow through said at least one main switch 152 and/or said at least one reference switch 151 to said at least one ring oscillator 120, and said at least one energy storage 130 may supply said at least one ring oscillator 120. Once said supply voltage value 121 of said at least one ring oscillator 120 may be superior than the reference voltage value 111, said at least one comparator 160 may switch on said at least one main switch 152 and/or said at least one reference switch 151 such as said at least one energy source 140 may supply said at least one voltage reference 110 and said at least one ring oscillator 120.

The invention claimed is:

1. A ring-oscillator control circuit comprising:
a voltage reference configured to hold a voltage reference value;
a ring oscillator configured to oscillate;
a power supply comprising an energy storage configured to supply said ring oscillator, and an energy source configured to supply said voltage reference and said ring oscillator; and
a supply controller configured to select said power supply among said energy storage and said energy source such as to supply said ring oscillator in function of said voltage reference, wherein said supply controller comprises a comparator, and comprises a main switch configured to be connected to a second input controller terminal of the comparator, to the energy storage and to said ring oscillator, and comprises a reference switch configured to be connected to said voltage reference and to a first input controller terminal of the comparator,
wherein the ring oscillator is electrically separated from the comparator by the main switch.

2. The ring-oscillator control circuit according to claim 1, wherein said energy source comprises a current mirror configured to be connected to said supply controller; said current mirror comprises an input diode connected PMOS transistor and a second PMOS transistor.

3. The ring-oscillator control circuit according to claim 2, wherein said input diode connected PMOS transistor comprises a first PMOS source connected to a first power terminal, a first PMOS drain connected to a first PMOS gate, and to said first input controller terminal of said supply controller.

4. The ring-oscillator control circuit according to claim 3, wherein said second PMOS transistor comprises a second PMOS source connected to a first power terminal, said second PMOS gate connected to said first PMOS gate, and a second PMOS drain connected to a second controller terminal of said supply controller.

5. The ring-oscillator control circuit according to claim 1, wherein said supply controller comprises the comparator having said first input controller terminal, said second controller terminal and a output controller terminal; said output controller terminal is configured to control said main switch and said reference switch such as to select said power supply of said ring oscillator in function of said voltage reference.

6. The ring-oscillator control method for operating a ring-oscillator control circuit according to claim 1, said ring-oscillator control circuit comprising an energy storage, a ring oscillator, a voltage reference, and a supply controller; said ring-oscillator control method comprising:
a comparison comparing the supply voltage value of said ring oscillator with the reference voltage value of said voltage reference;
a selection supplying said ring oscillator by selecting said energy storage as power supply when said supply voltage value is different from said reference voltage value.

7. A ring-oscillator control method according to claim 6, wherein said selection occurs when said supply voltage value is inferior than said reference voltage value.

8. The ring-oscillator control circuit according to claim 1, wherein the comparator comprises an output controller terminal,
wherein the ring oscillator is electrically separated from the output controller terminal and the second input controller terminal of the comparator by the main switch.

9. The ring-oscillator control circuit according to claim 8, wherein the ring oscillator is directly electrically connected to the output controller terminal and the second input controller terminal of the comparator by the main switch.

10. The ring-oscillator control circuit according to claim 8, wherein the output controller terminal of the comparator is directly electrically connected to both the main switch and the reference switch.

11. The ring-oscillator control circuit according to claim 8, wherein the voltage reference is electrically separated from the output controller terminal and the first input controller terminal of the comparator by the reference switch.

\* \* \* \* \*